United States Patent
Jain et al.

(10) Patent No.: US 11,183,456 B2
(45) Date of Patent: Nov. 23, 2021

(54) MEMORY ARRAYS AND METHODS USED IN FORMING A MEMORY ARRAY

(71) Applicant: Micron Technology, Inc., Boise, ID (US)

(72) Inventors: Harsh Narendrakumar Jain, Boise, ID (US); Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 16/743,329

(22) Filed: Jan. 15, 2020

(65) Prior Publication Data

US 2021/0217694 A1    Jul. 15, 2021

(51) Int. Cl.
| | |
|---|---|
| H01L 27/11582 | (2017.01) |
| H01L 27/11573 | (2017.01) |
| H01L 21/762 | (2006.01) |
| H01L 21/768 | (2006.01) |
| H01L 23/522 | (2006.01) |
| H01L 23/48 | (2006.01) |
| H01L 23/528 | (2006.01) |
| H01L 21/311 | (2006.01) |
| H01L 27/11556 | (2017.01) |

(Continued)

(52) U.S. Cl.
CPC ...... *H01L 23/528* (2013.01); *H01L 21/31111* (2013.01); *H01L 21/76224* (2013.01); *H01L 21/76802* (2013.01); *H01L 21/76877* (2013.01); *H01L 23/5226* (2013.01); *H01L 27/11519* (2013.01); *H01L 27/11556* (2013.01); *H01L 27/11565* (2013.01); *H01L 27/11582* (2013.01)

(58) Field of Classification Search
CPC ......... H01L 27/11565; H01L 27/11575; H01L 27/11573; H01L 27/11582
See application file for complete search history.

(56) References Cited

U.S. PATENT DOCUMENTS

| 10,903,237 B1 * | 1/2021 | Hosoda ............. H01L 27/11519 |
| 2013/0187112 A1 | 7/2013 | Kuniya |

(Continued)

OTHER PUBLICATIONS

Mackus et al., "From the Bottom-Up: Toward Area-Selective Atomic Layer Deposition with High Selectivity", Chemistry of Materials, vol. 31, 2019, United States, pp. 2-12.

(Continued)

*Primary Examiner* — Brian Turner
(74) *Attorney, Agent, or Firm* — Wells St. John P.S.

(57) ABSTRACT

A method used in forming a memory array comprising strings of memory cells comprises forming a stack comprising vertically-alternating first tiers and second tiers having channel-material strings therein. Conductive vias are formed through insulating material that is directly above the channel-material strings. Individual of the conductive vias are directly electrically coupled to individual of the channel-material strings. After forming the conductive vias, horizontally-elongated trenches are formed into the stack to form laterally-spaced memory-block regions. Intervening material is formed in the trenches laterally-between and longitudinally-along the immediately-laterally-adjacent memory-block regions. Additional methods and structures independent of method are disclosed.

37 Claims, 16 Drawing Sheets

(51) Int. Cl.
*H01L 27/11519* (2017.01)
*H01L 27/11565* (2017.01)

(56) References Cited

U.S. PATENT DOCUMENTS

2020/0027892 A1\* 1/2020 Zhu ................... H01L 21/76802
2020/0185407 A1\* 6/2020 Xiao ................... H01L 23/5226
2021/0104539 A1 4/2021 Lee

OTHER PUBLICATIONS

U.S. Appl. No. 16/793,263, filed Feb. 18, 2020, by Vahdat et al.

\* cited by examiner

MEMORY ARRAYS AND METHODS USED IN FORMING A MEMORY ARRAY

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228659, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-40 which may be considered as a "gate-last" or "replacement-gate" process, and starting with FIGS. 1-5.

Figure 1:
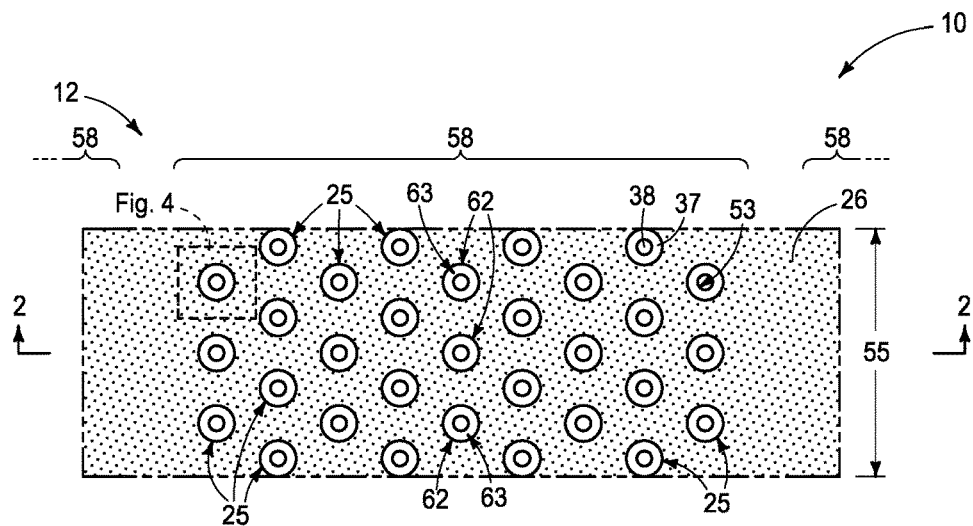
FIG. 1 is a diagrammatic cross-sectional view of a portion of a substrate in process in accordance with an embodiment of the invention and is taken through line 1-1 in FIG. 2.
Figure 2:
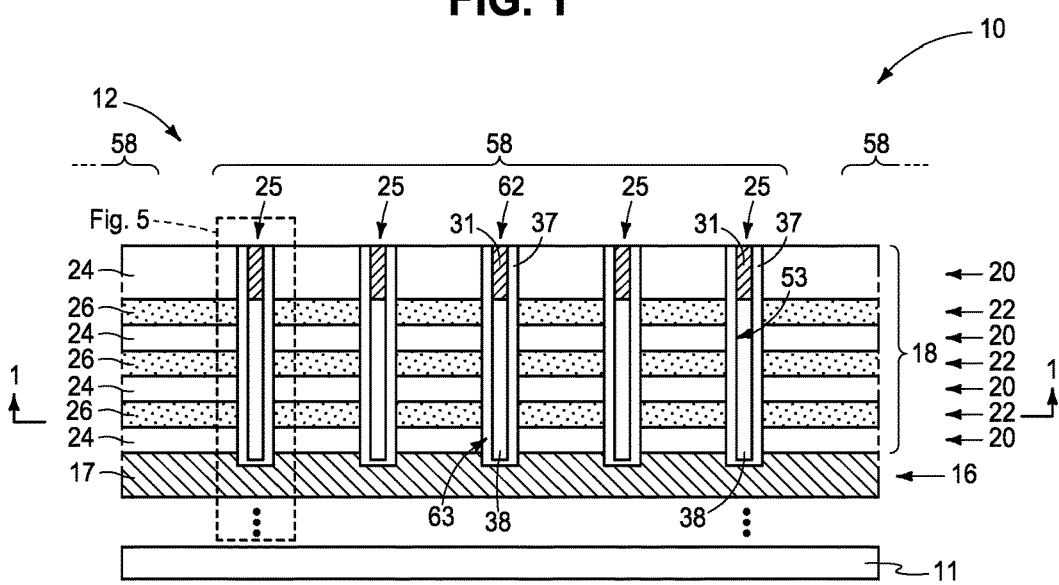
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is up to 60 nanometers. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22. Alternately or additionally, at least one of the depicted uppermost and lowest conductive tiers 22 may be a select gate tier. Regardless, conductive tiers 22 (alternately referred to as first tiers) may not comprise conducting material and insulative tiers 20 (alternately referred to as second tiers) may not comprise insulative material or be insulative at this point in processing in conjunction with the hereby initially-described example method embodiment which is "gate-last" or "replacement-gate". Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial.

Channel openings 25 and dummy-structure openings 62 (optional) have been formed (e.g., by etching) through insulative tiers 20 and conductive tiers 22 to conductor tier 16. In this document, a "dummy-structure opening" is an opening in which a "dummy structure" has been or will be formed. A "dummy structure" is a circuit-inoperative structure that may be in a finished circuitry construction and, if so, in all operation of the circuitry has no current flow there-through and which may be a circuit inoperable dead end that is not part of a current flow path of a circuit even if extending to or from an electronic component. Dummy-structure openings 62 may be optionally provided for process uniformity in forming operative channel openings 25 and material therein. Openings 25 and 62 may taper radially-inward (not shown) moving deeper in stack 18. In some embodiments, openings 25 and 62 may go into conductor material 17 of conductor tier 16 as shown or may stop there-atop (not shown). Alternately, as an example, openings 25 and 62 may stop atop or within the lowest insulative tier 20. A reason for extending channel openings 25 at least to conductor material 17 of conductor tier 16 is to assure direct electrical coupling of subsequently-formed channel material (not yet shown) to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, openings 25/62 are shown as being arranged in groups or columns of staggered rows of four and five openings 25/62 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a direction 55. Memory-block regions 58 may otherwise not be discernable at this point of processing. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

FIGS. 1, 2, 4, and 5 show one embodiment wherein charge-blocking material 30, storage material 32, and charge-passage material 34 have been formed in individual openings 25 and 62 elevationally along insulative tiers 20 and conductive tiers 22. Transistor materials 30, 32, and 34 (e.g., memory-cell materials) may be formed by, for example, deposition of respective thin layers thereof over stack 18 and within individual openings 25 and 62 followed by planarizing such back at least to a top surface of stack 18.

Channel material 36 has also been formed in openings 25 and 62 elevationally along insulative tiers 20 and conductive tiers 22, thus comprising individual operative channel-material strings 53 in channel openings 25 and dummy structures 63 in dummy-structure openings 62. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment, conducting material 31 (e.g., a conductive plug such as conductively-doped polysilicon) is directly against laterally-inner sides 79 in an upper portion of individual channel-material strings 53. One or more of materials 30, 32, 34, and 36 may not extend to the top of conducting material 31 (not shown). Further, and regardless, conducting material 31 may not extend to the top of stack 18 (not shown), may extend above stack 18 (not shown), and/or may extend below the bottom of uppermost tier 20 (not shown). Dummy structures 63 may have the same configuration as the materials in channel openings 25.

Figure 3:
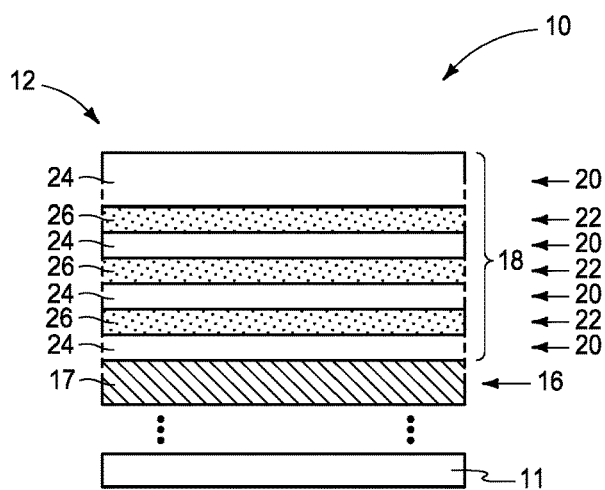
FIG. 3 is a diagrammatic cross-sectional view of a portion of the FIGS. 1 and 2 construction at an example different location from that shown by FIGS. 1 and 2.
Figure 4:
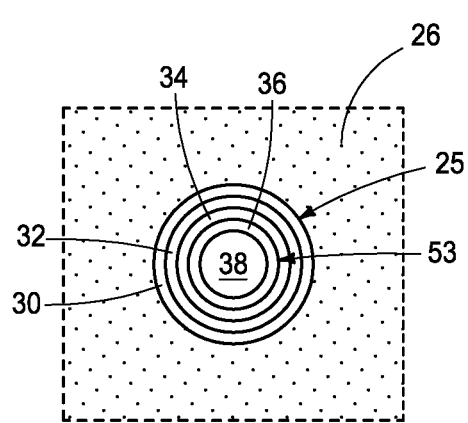
FIGS. 4-38 are diagrammatic sequential sectional, expanded, enlarged, and/or partial views of the construction of FIGS. 1-3, or portions thereof, in process in accordance with some embodiments of the invention.
Figure 5:
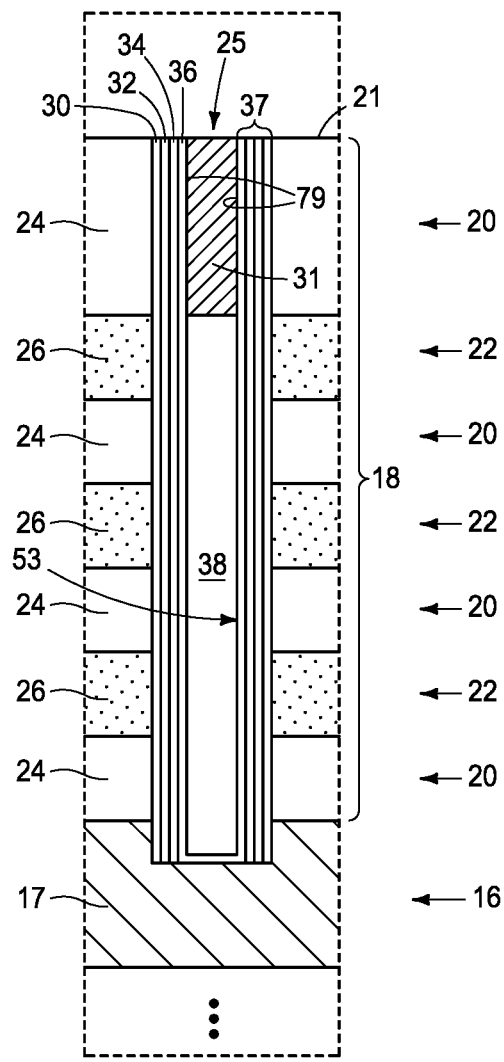

FIG. 3 shows part of a through-array-via (TAV) region that may be part of array 12 or laterally-outward thereof. In this document, a "TAV region" is a region in which operative TAVs are present or will be formed. An "operative TAV" is a circuit-operative conductive interconnect extending through stack 18 and between electronic components at different elevations in a finished construction of integrated circuitry that has been or is being fabricated (not yet shown). A TAV region may also contain one or more dummy structures that may be one or more dummy TAVs (i.e., a circuit-inoperative structure extending through stack 18 of the same construction as an operative TAV and that may be in a finished construction of integrated circuitry that has been or is being fabricated, and not shown). The TAV region may be undefined or indistinguishable in construction 10 at this point in processing. By way of examples only, the TAV region may be in a memory plane or outside of a memory plane (e.g., being edge-of-plane or in a stair-step region).

Figure 6:
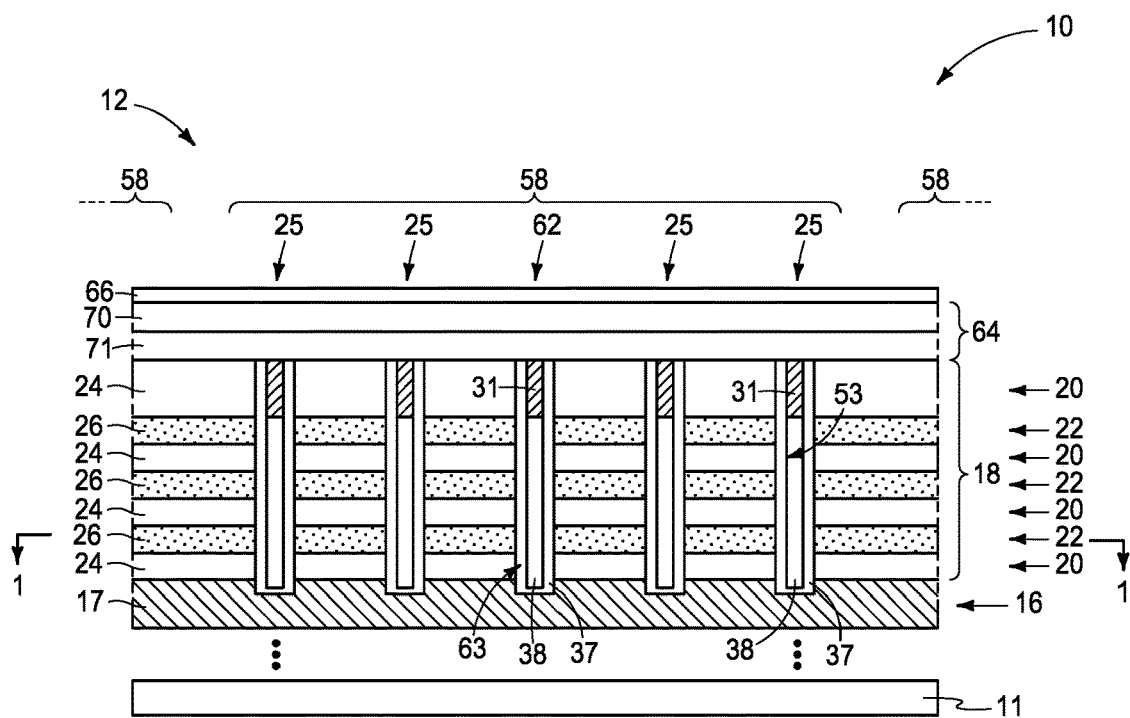
Figure 7:
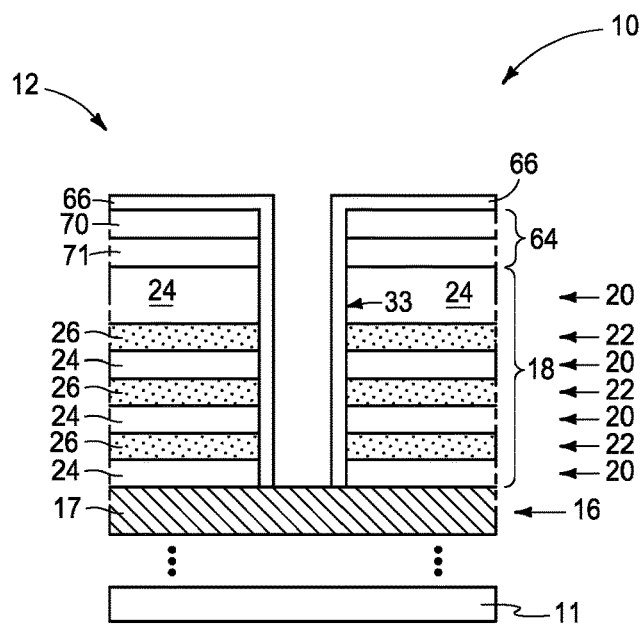

Referring to FIGS. 6 and 7, and in one embodiment, TAV openings 33 (only one being shown) have been formed in stack 18. Insulating material 64 (e.g., silicon dioxide and/or silicon nitride materials 70, 71) may be formed atop stack 18 prior to forming TAV openings 33. By way of examples only, insulative materials 70 and 71 may have been formed and used relative to patterning in a staircase area (not shown) not otherwise particularly relevant to aspects of the inventions disclosed herein. An insulating liner 66 (e.g., silicon dioxide and/or silicon nitride) has subsequently been deposited atop stack 18 and to line and less-than-fill TAV openings 33.

Figure 8:
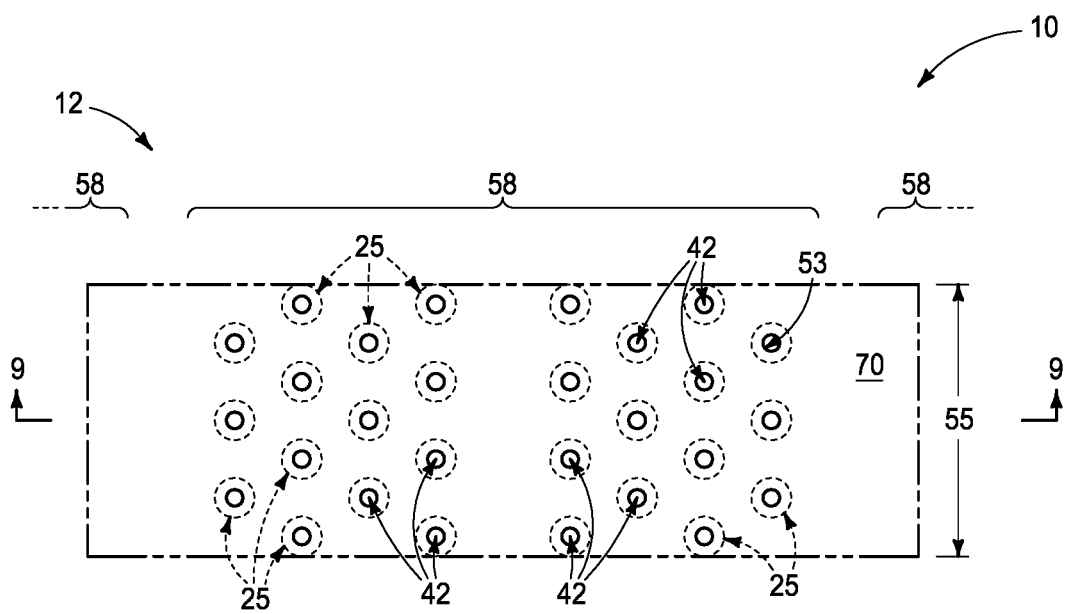
Figure 9:
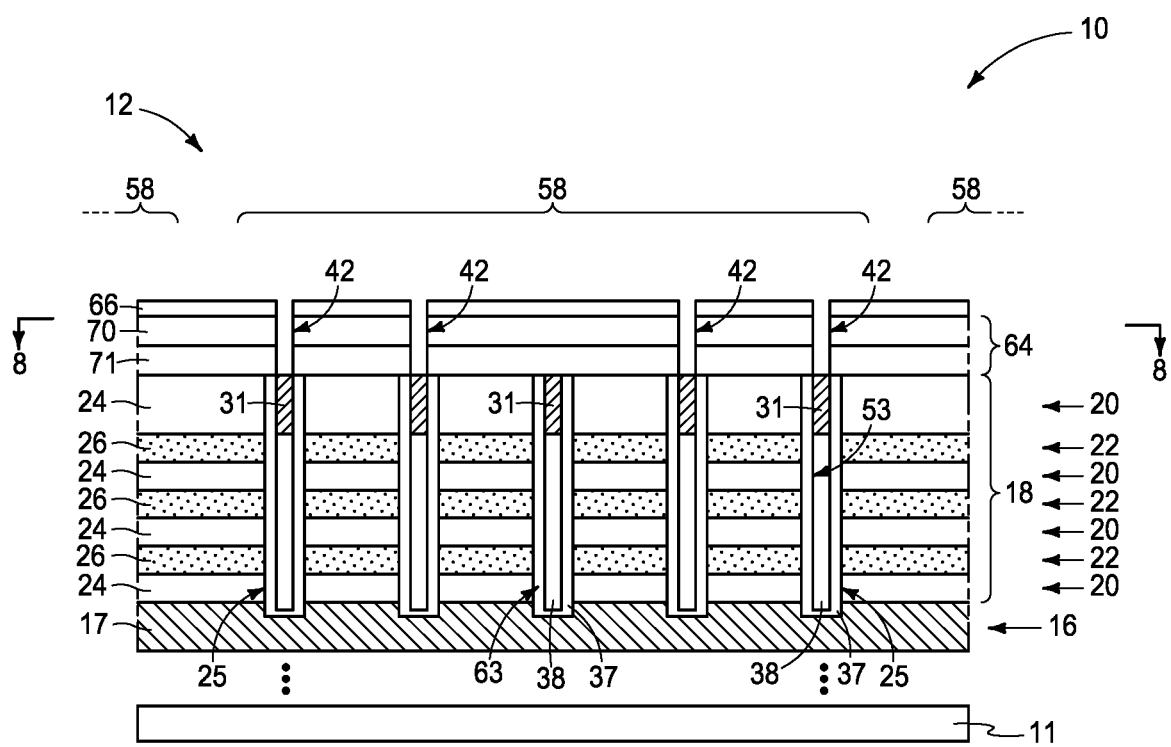

Referring to FIGS. 8 and 9, conductive-via openings 42 have been formed in insulating material (e.g., 64, 66) that is directly above channel-material strings 53. In one embodiment, conductive-via openings 42 are above, in one such embodiment directly above, individual channel-material strings 53.

Figure 10:
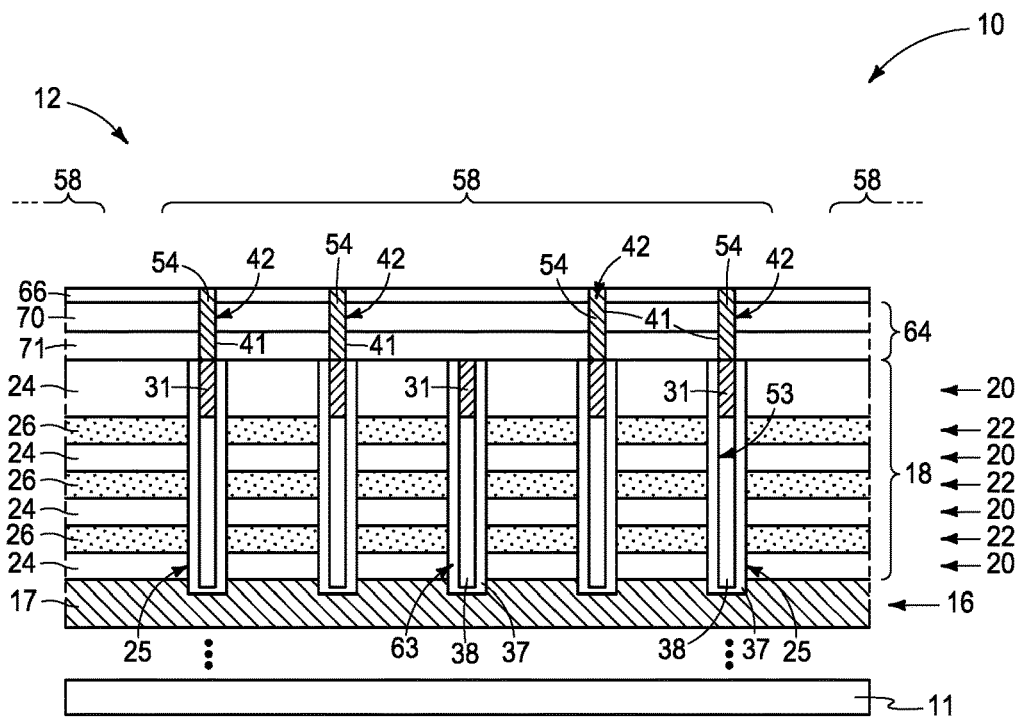
Figure 11:
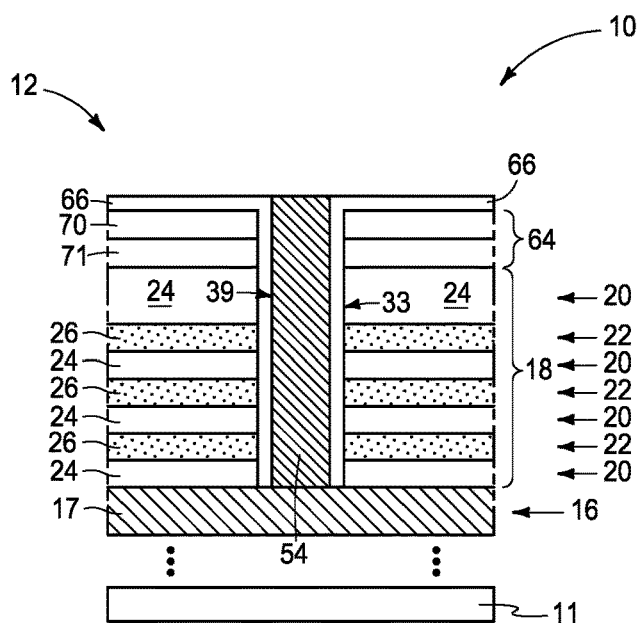

Referring to FIGS. 10 and 11, conductive material 54 has been formed in conductive-via openings 42 thereby forming conductive vias 41 through insulating material 64, 66 that are individually directly electrically coupled to individual channel-material strings 53 (e.g., through conducting material 31). In one embodiment and as shown, conductive material 54 is also formed in TAV openings 33 and at the same time that conductive material 54 is formed in conductive-via openings 42, thereby forming TAVs 39.

The above example processing shows the forming of TAV openings 33 and conductive-via openings 42 at different times and which, in one embodiment, has formed TAV openings 33 before forming conductive-via openings 42. Alternately, TAV openings 33 could be formed after forming conductive-via openings 42. Regardless, an example technique of forming the FIGS. 10 and 11 construction is to deposit conductive material 54 to overfill TAV openings 33 and overfill conductive-via openings 42, followed by polishing such back at least to the upper surface of insulating material 64, 66.

Figure 12:
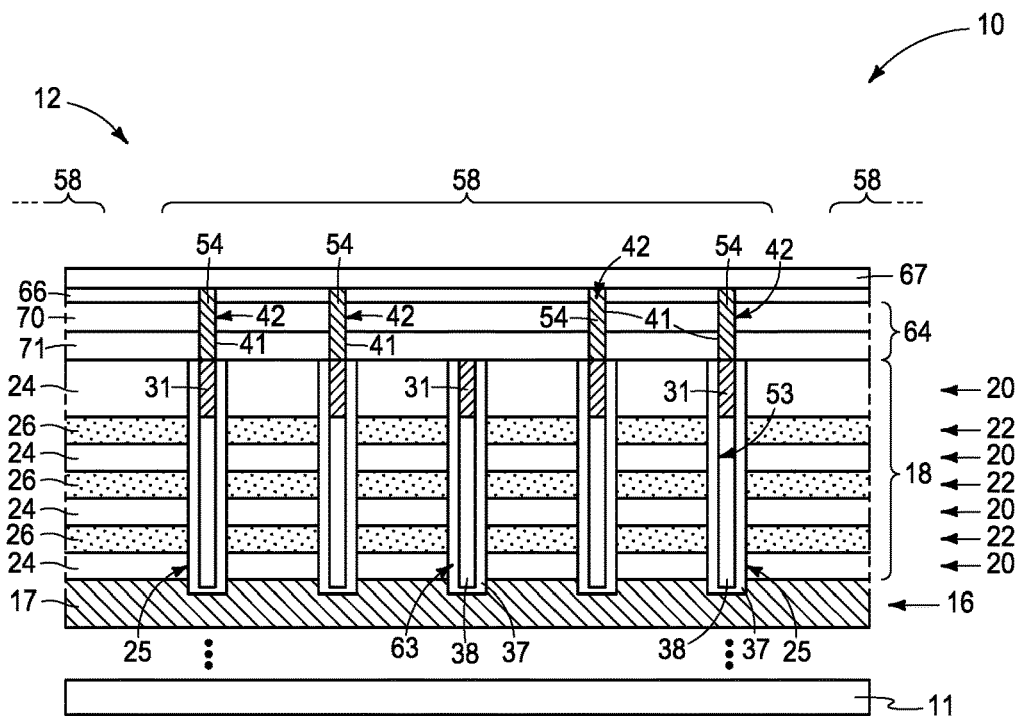
Figure 13:
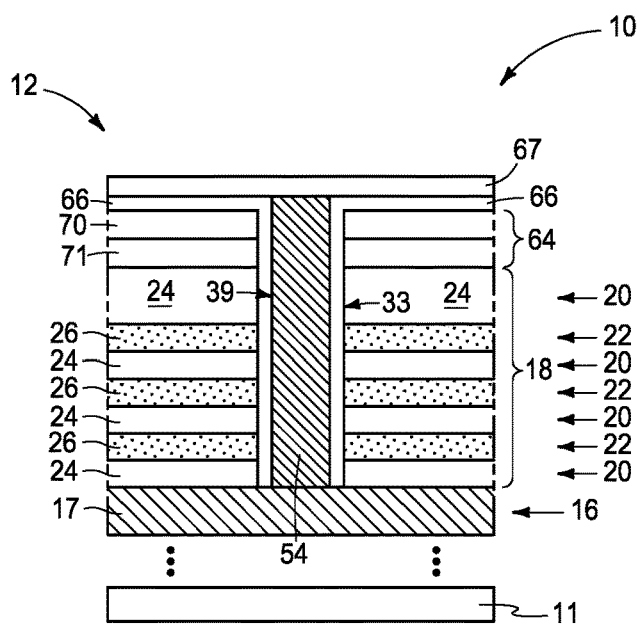

FIGS. 12 and 13 show an insulating layer 67 (e.g., silicon dioxide when material 26 is silicon nitride) as having been subsequently deposited. Such may be used, for example, to protect vias 41 and 39 during a subsequent strip of material 26 as described below.

Figure 14:
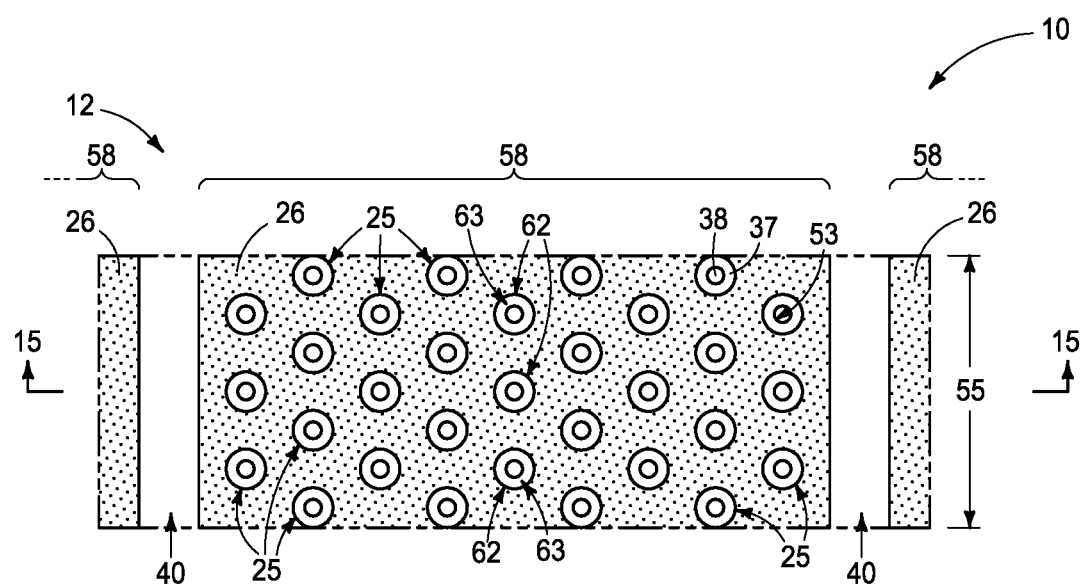
Figure 15:
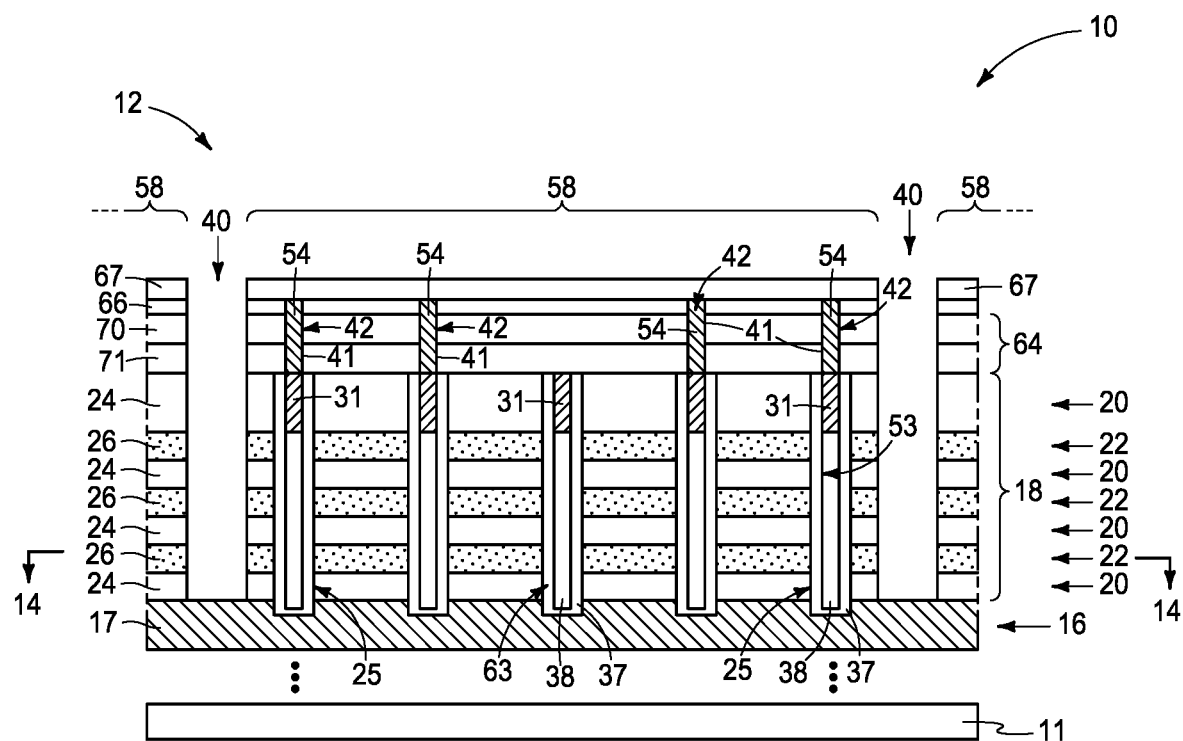
Figure 16:
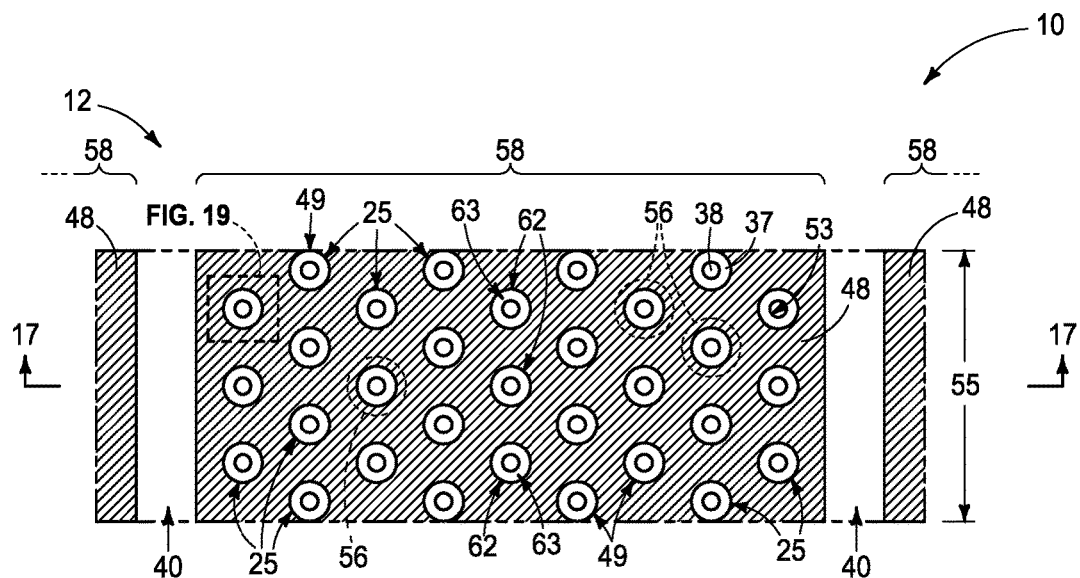
Figure 17:
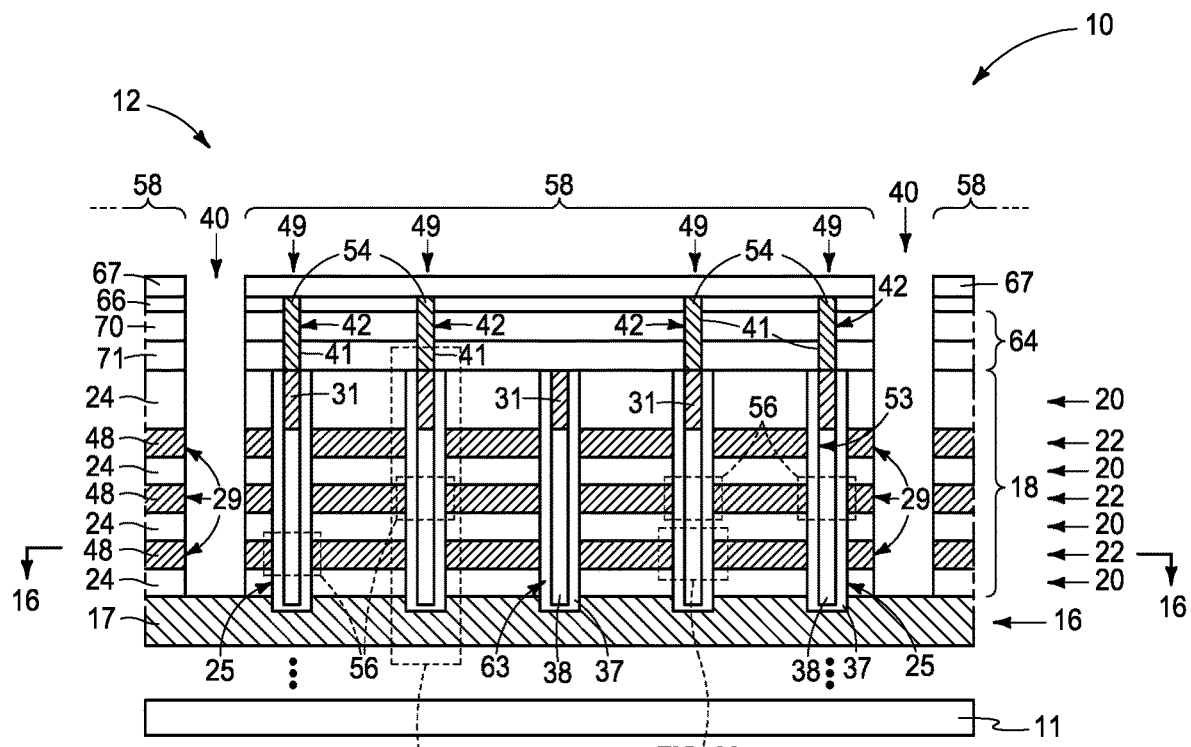
Figure 18:
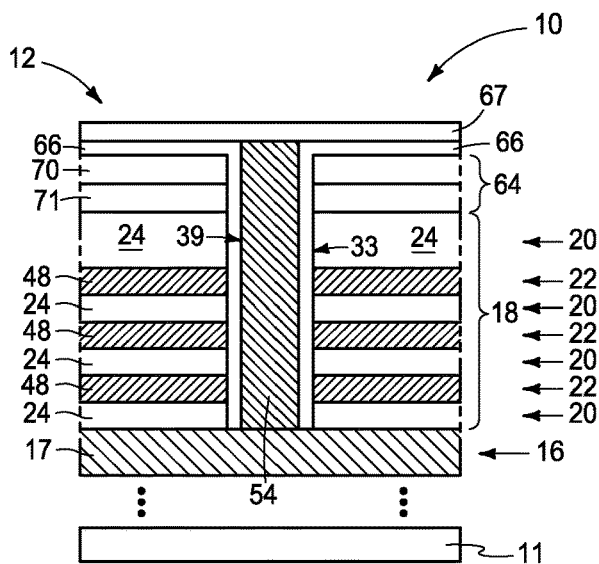
Figure 19:
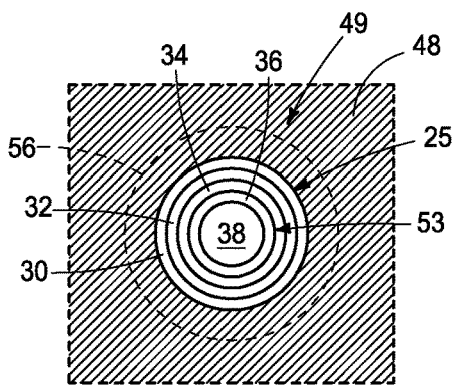
Figure 20:
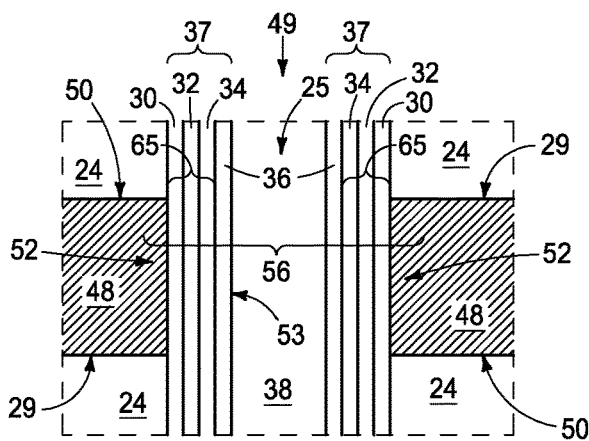
Figure 21:
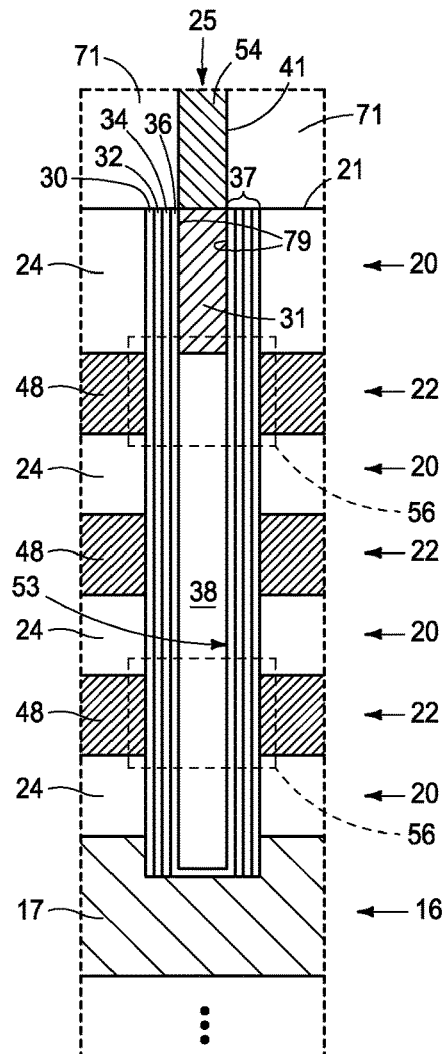

Referring to FIGS. 14 and 15, and in one embodiment after forming conductive vias 41, horizontally-elongated trenches 40 have been formed (e.g., by anisotropic etching) through materials 66, 64, and into stack 18 to form laterally-spaced memory-block regions 58. Trenches 40 may have respective bottoms that are directly against conductor material 17 (atop or within) of conductor tier 16 (as shown) or may have respective bottoms that are above conductor material 17 of conductor tier 16 (not shown).

Referring to FIGS. 16-21, and in one embodiment, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 20 and some with dashed outlines in FIGS. 16, 17, 19, and 21, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 20) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 22:
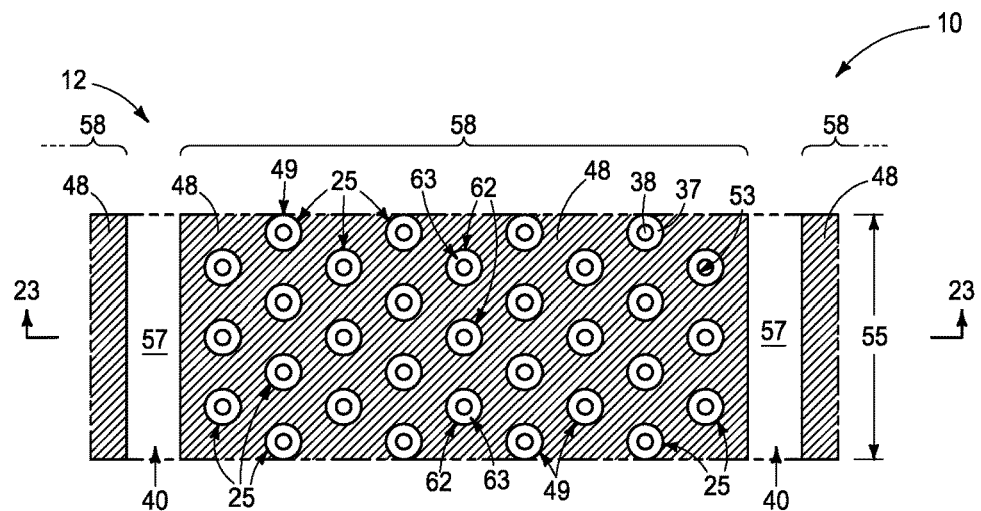
Figure 23:
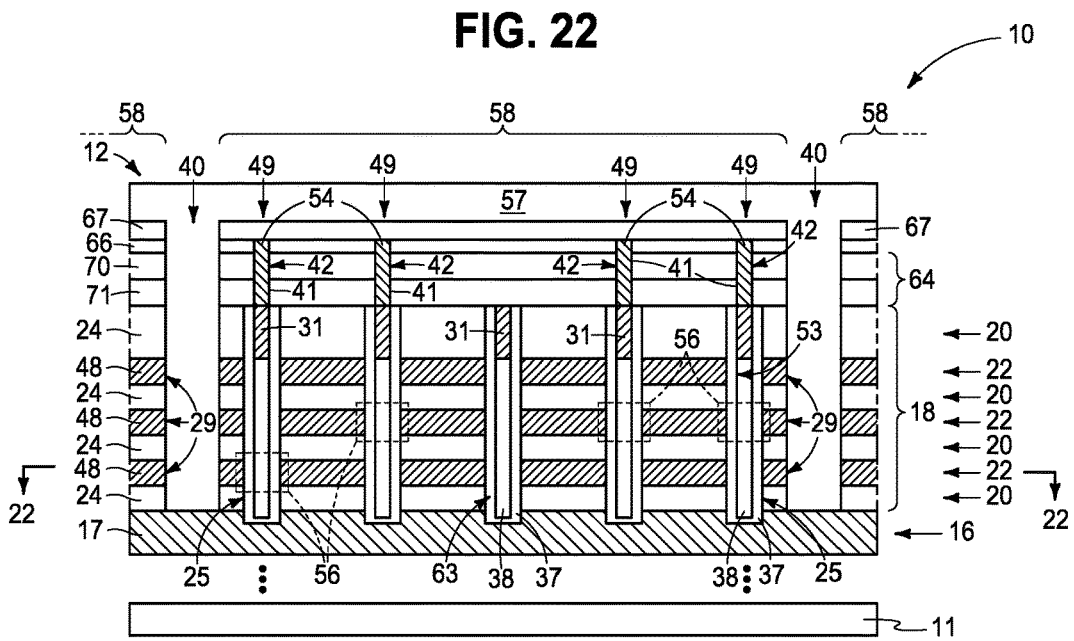
Figure 24:
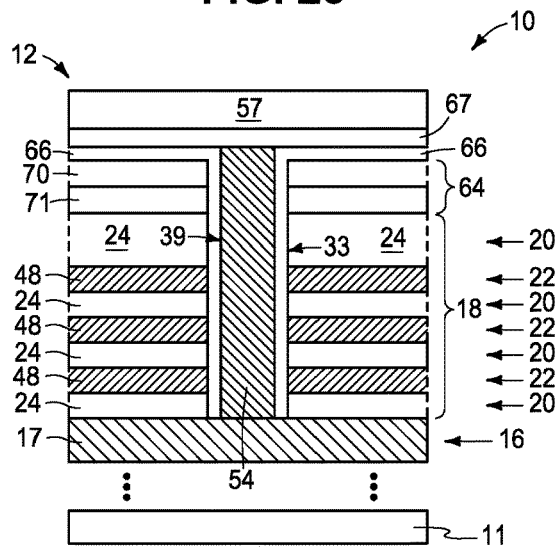

Referring to FIGS. 22-24, and in one embodiment, intervening material 57 has been formed in trenches 40 laterally-between and longitudinally-along immediately-laterally-adjacent memory-block regions 58. Intervening material 57 may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include TAVs (not shown).

Figure 25:
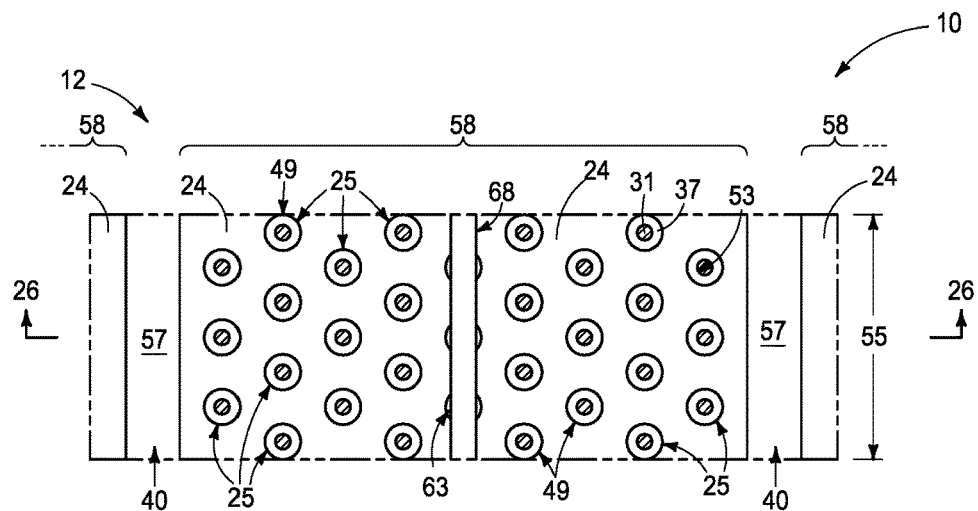
Figure 26:
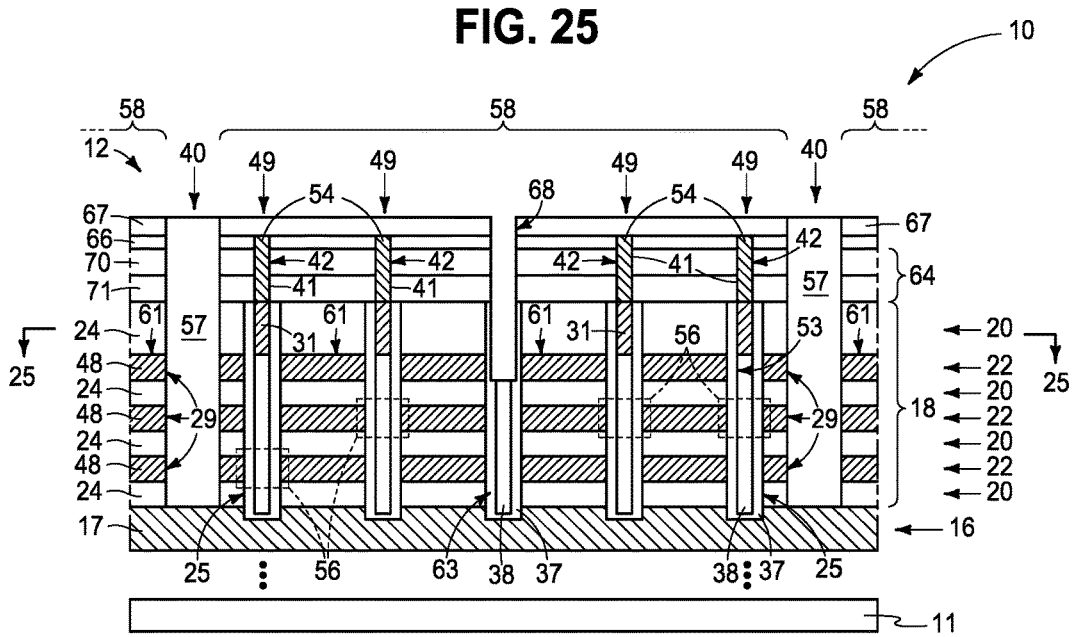
Figure 27:
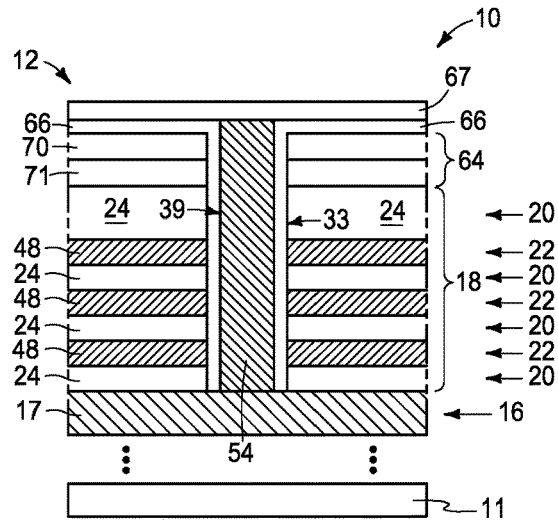

Referring to FIGS. 25-27, intervening material 57 has been removed back (e.g., by polish or etch) at least to the top surface of material 67. Further, and in one embodiment after forming intervening material 57, a horizontally-elongated isolation trench 68 (i.e., at least one) has been formed in a top part of stack 18 (and through materials there-above in the depicted example), with example isolation trench 68 extending along direction 55 (e.g., being parallel therewith), thereby forming laterally-spaced select gates 61 (e.g., select-gate-drains [SGD]) on opposite sides of trench 68 and that extending laterally to intervening material 57.

Figure 28:
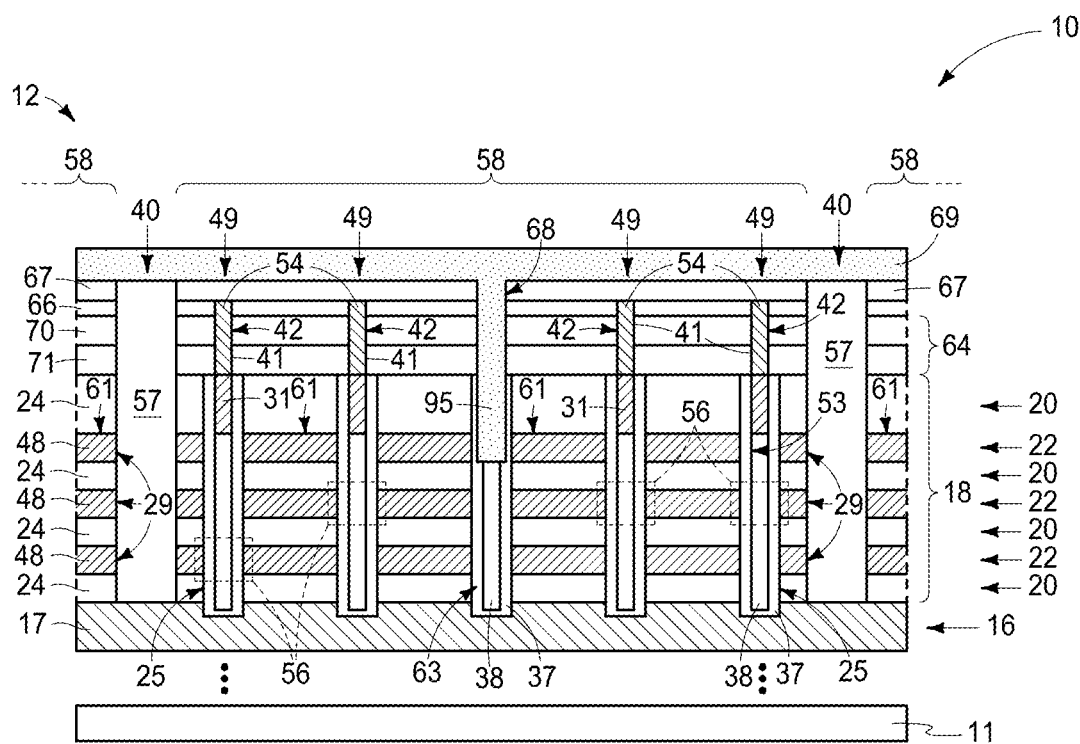
Figure 29:
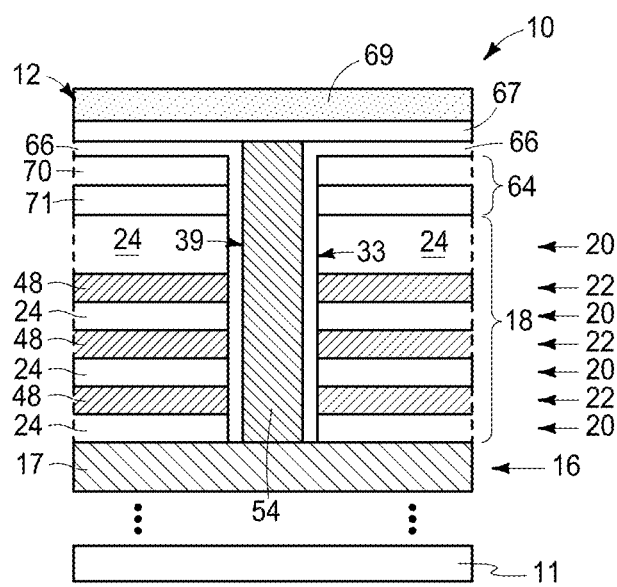

Referring to FIGS. 28 and 29, insulating material 69 (e.g., silicon dioxide) has been formed atop the depicted construction and in trench 68 to form at least one horizontally-elongated isolation structure 95 in a top part of stack 18 in individual memory-block regions 58.

Figure 30:
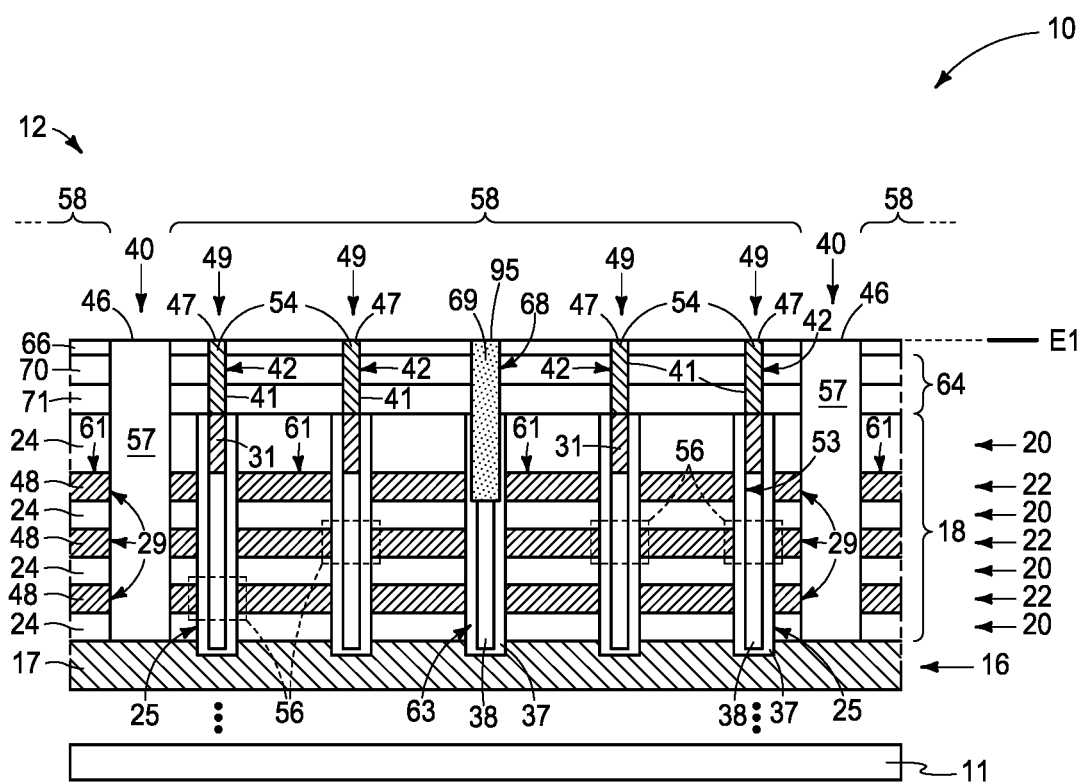
Figure 31:
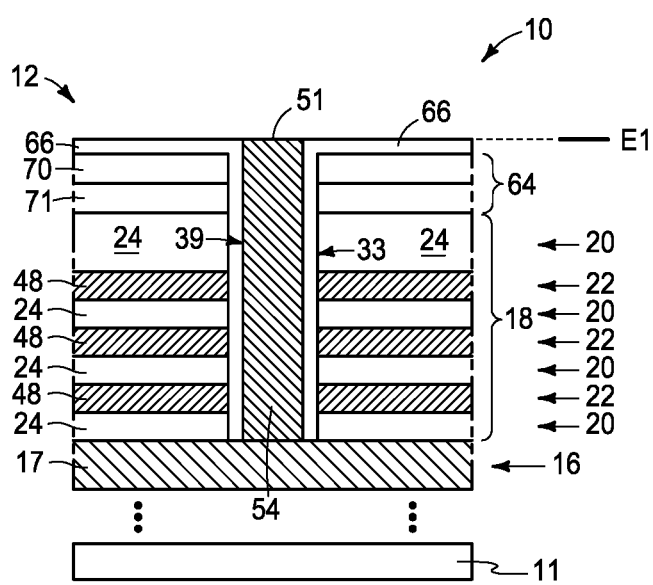
Figure 32:
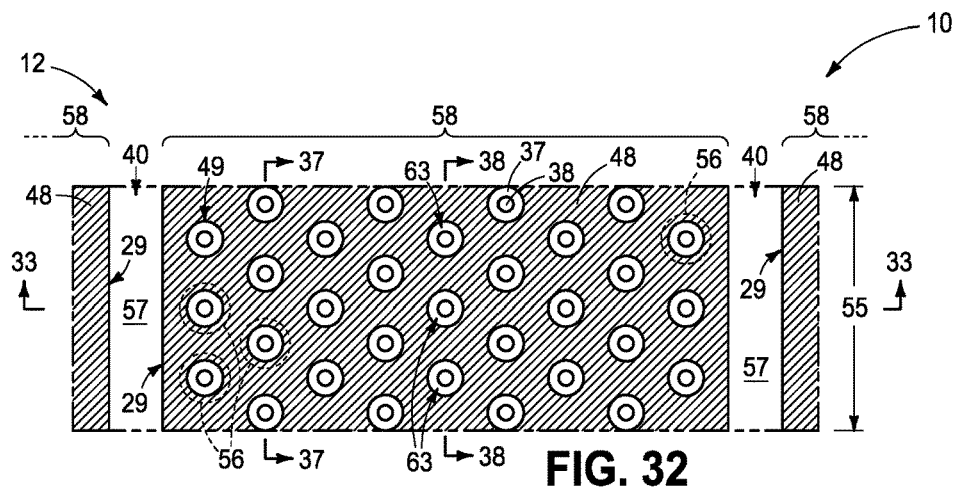
Figure 33:
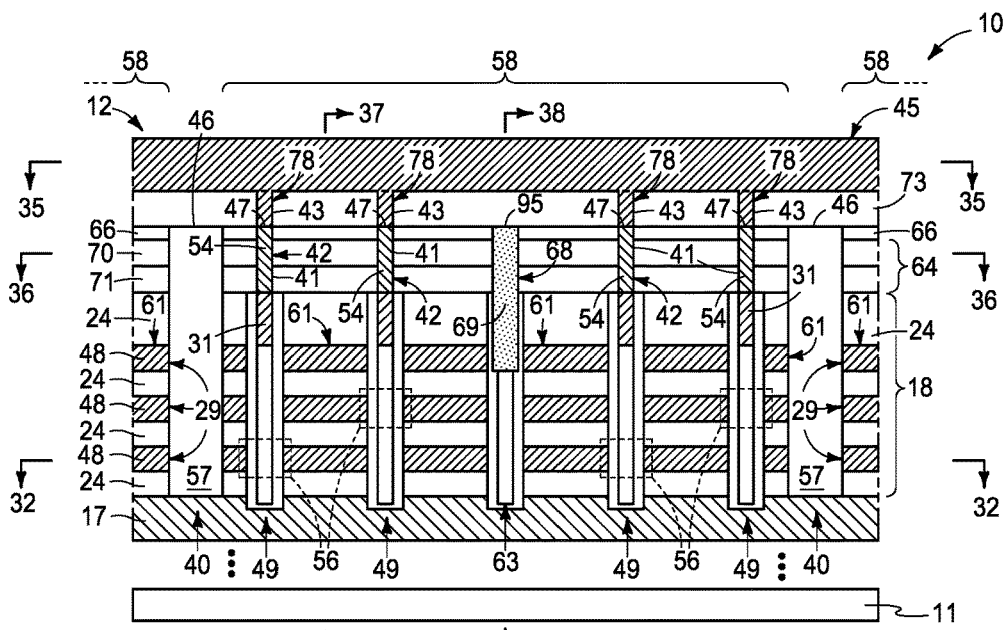
Figure 34:
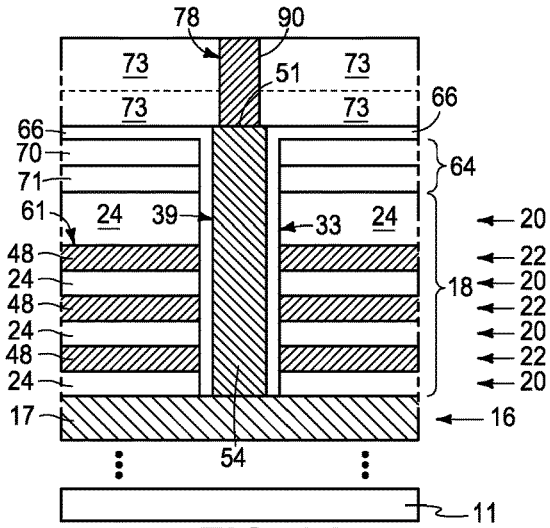
Figure 35:
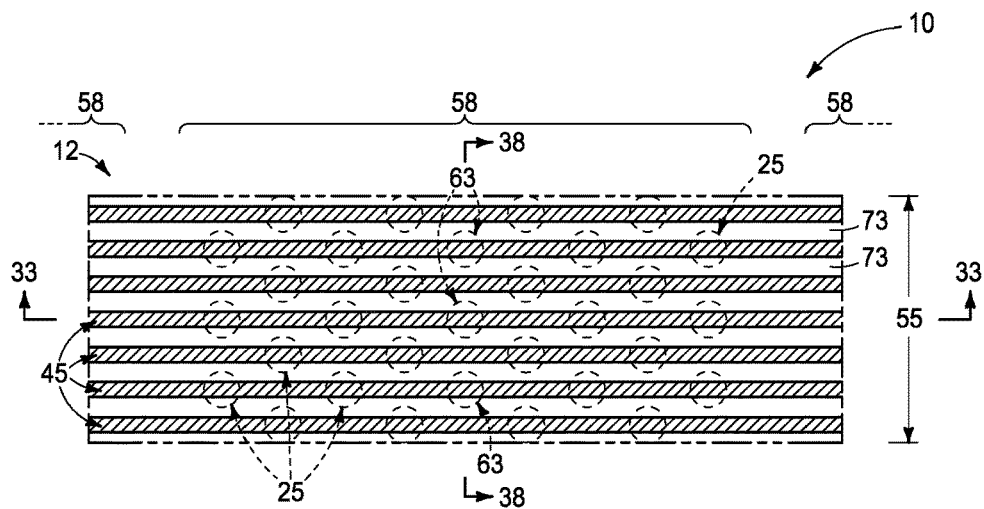
Figure 36:
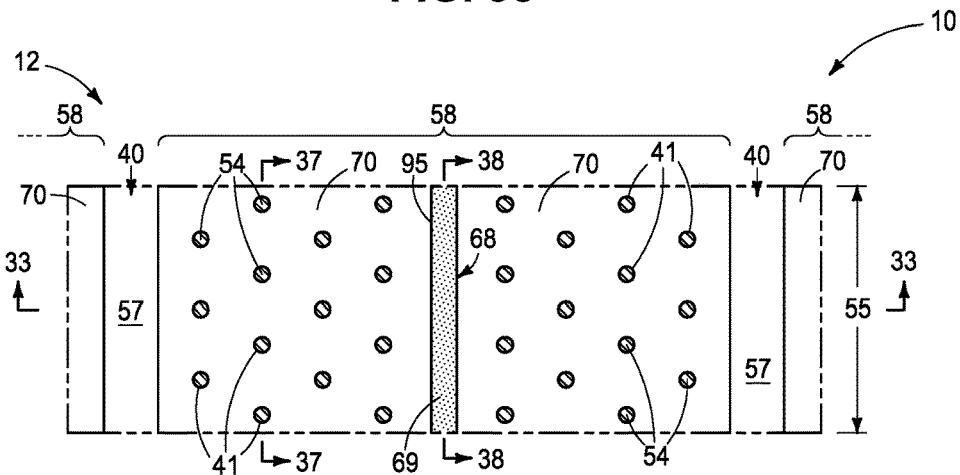
Figure 37:
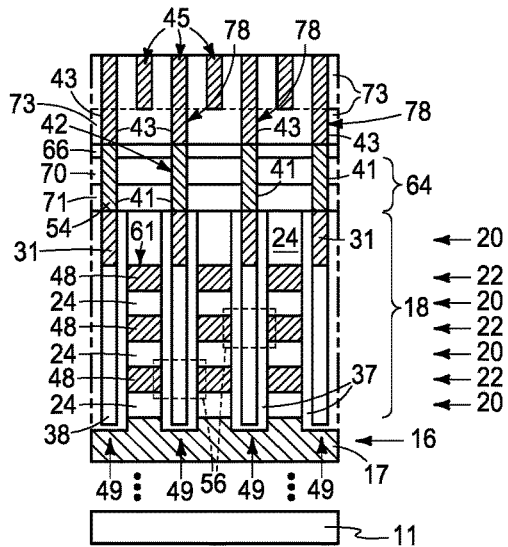
Figure 38:
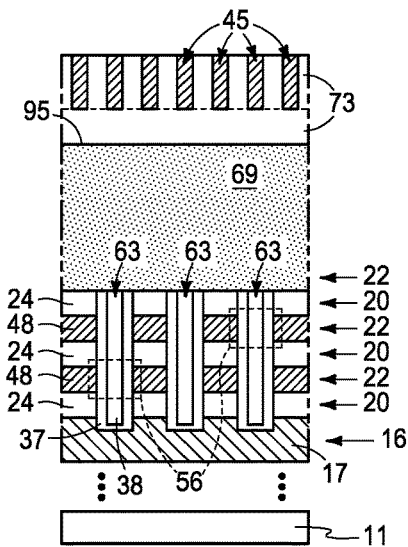
Figure 39:
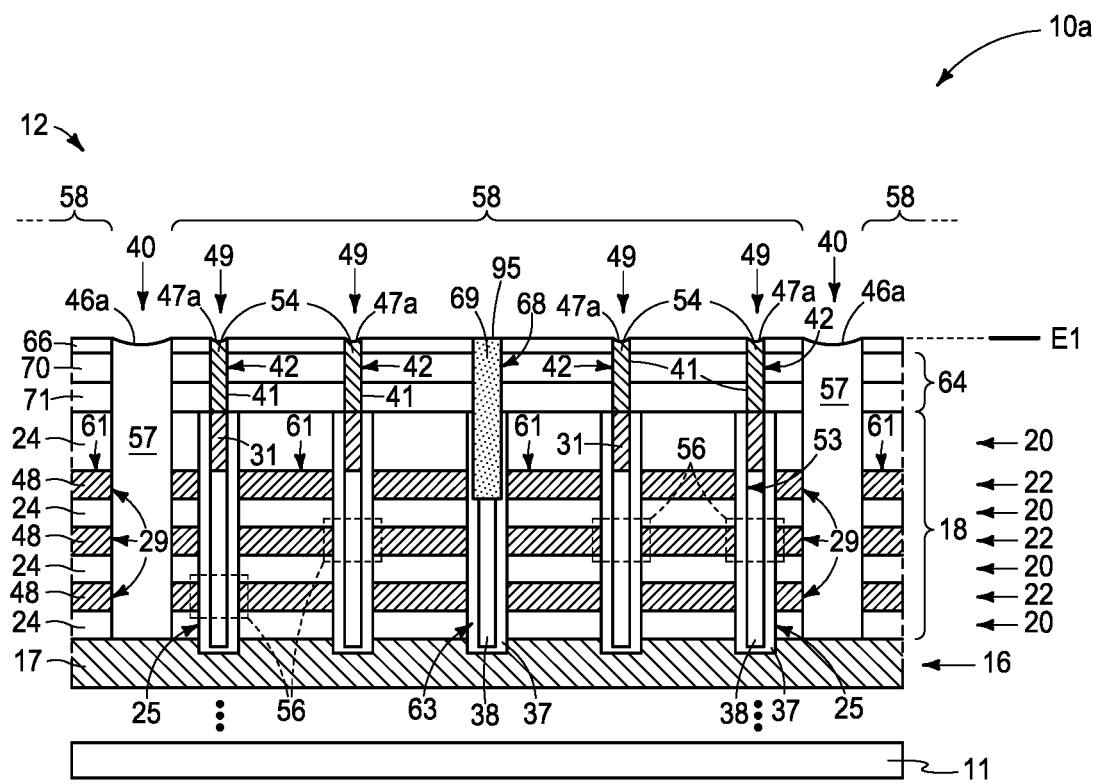
FIGS. 39 and 40 show alternate example method and/or structural embodiments of the invention.
Figure 40:
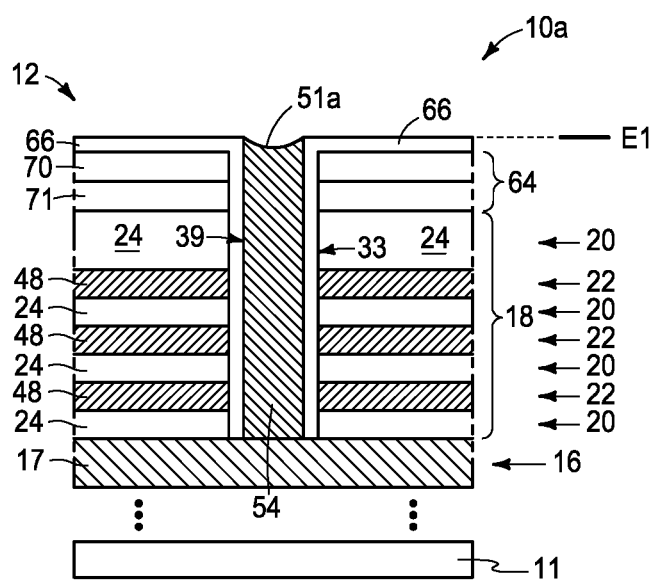

Referring to FIGS. 30 and 31, and in one embodiment, construction 10 of FIGS. 28 and 29 has been polished back at least to the top of material 66. TAVs 39 may be considered to have respective top surfaces 51 and conductive vias 41 may be considered to have respective top surfaces 47. Top surfaces 51 and 47 are shown as being planar but alternately one or both of such may not be planar. Regardless, in one embodiment, at least a portion of respective conductive-via-top surfaces 47 are elevationally-coincident with at least a portion of respective TAV-top surfaces 51 as shown (e.g., at a common level E1).

Further, in one embodiment and as shown, all of respective conductive-via-top surfaces 47 are elevationally-coincident with all of respective TAV-top surfaces 51 (e.g., as each is horizontally planar at E1). Alternately, only a portion of respective conductive-via-top surfaces 47 may be elevationally-coincident with only a portion of respective TAV-top surfaces 51 (e.g., if surfaces 47 and/or 51 are not planar and if planar are not horizontally planar), for example as shown with respect to an alternate construction 10a in FIGS. 39 and 40. Like numerals from the above-described embodiments have been used where appropriate, with some construction differences being indicated with the suffix "a". Example surfaces 47a and 51a are not horizontally planar, thereby only a portion of respective conductive-via-top surfaces 47a are elevationally-coincident with only a portion of respective TAV-top surfaces 51a at E1. Any other attribute(s) or aspect(s) as shown and/or described herein with respect to other embodiments may be used.

In one embodiment and as shown with respect to construction 10, intervening material 57 extends upwardly from the uppermost of alternating first and second tiers 20 and 22 in stack 18 to a respective top surface 46 thereof between memory-block regions 58. Top surfaces 46 may be planar (e.g., horizontally, as shown) or may be non-planar (not shown). In one embodiment, at least a portion of respective intervening-material-top surfaces 46 is elevationally-coincident with at least a portion of respective conductive-via top surfaces 47. In one embodiment, at least a portion of respective intervening-material-top surfaces 46 is elevationally-coincident with at least a portion of respective conductive-via-top surfaces 47 (e.g., at E1).

Further, in one embodiment and as shown, all of respective intervening-material top surfaces 46 are elevationally-coincident with all of respective conductive-via-top surfaces 47 (e.g., as each is horizontally planar at E1). Alternately, only a portion of respective intervening-material-top surfaces 46 may be elevationally-coincident with only a portion of respective conductive-via-top surfaces 47 (e.g., if surfaces 46 and/or 47 are not planar and if planar are not horizontally planar, neither being shown), for example as shown with respect to alternate construction 10a in FIGS. 39 and 40. Example surfaces 46a and 47a are not horizontally planar, thereby only a portion of respective conductive-via-top surfaces 47a are elevationally-coincident at E1 with only a portion of respective intervening-material top surfaces 46a. Any other attribute(s) or aspect(s) as shown and/or described herein with respect to other embodiments may be used.

In one embodiment, conductive vias 41 may be considered as being first conductive vias 41, with a method further comprising forming second conductive vias that individually are directly above and directly electrically coupled to individual first conductive vias 41. Further, and regardless, conductive vias may be formed that individually are directly above and directly electrically coupled to individual TAVs 39. Such are shown by way of example with respect to FIGS. 32-38. Such show formation of insulating material 73 atop construction 10 of FIGS. 30 and 31, followed by formation of openings 78 therein to first conductive vias 41 and to TAVs 39 (may be the same or different size and/or shape). Openings 78 have subsequently been filled with conducting material, thereby forming individual second conductive vias 43 to individual first conductive vias 41 and individual conductive vias 90 to individual TAVs 39. Example digitlines 45 have been formed atop second conductive vias 43 and which directly electrically coupled thereto. Further, and by way of example only, formation of the digitlines 45 and second conductive vias 43 may essentially occur during the same conductive-material deposition step, for example in a dual-damascene-like process.

Materials/vias 31, 41, and 43 may be of different compositions or of the same composition relative any two of one another. For simplicity and clarity in the figures, materials/vias 31, 41, and 43 are shown as being of the same size and shape in horizontal and vertical cross-sections and perfectly aligned relative one another, but of course need not be so. Further, and regardless, the respective sizes and shapes need not be constant (although constant is shown) in different horizontal and/or vertical cross-sections through the centers of materials/vias 31, 41, and 43.

Any other attribute(s) or aspect(s) as shown and/or described herein with respect to other embodiments may be used in the embodiments shown and described with reference to FIGS. 1-40.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises strings (e.g., 49) of memory cells (e.g., 56). The memory array comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) are in the stack. Intervening material (e.g., 57) is laterally-between and longitudinally-along the immediately-laterally-adjacent memory blocks. The intervening material extends upwardly from an uppermost of the alternating insulative and conductive tiers to a respective top surface (e.g., 46, 46a) thereof between the blocks. Conductive vias (e.g., 41) are in insulating material (e.g., 64) that is directly above the channel-material strings. Individual of the conductive vias are directly electrically coupled to individual of the channel-material strings (e.g., through conductive material 31). The conductive vias have respective top surfaces (e.g., 47, 47a). At least a portion of the respective intervening-material-top-surfaces are elevationally-coincident with at least a portion of the respective conductive-via-top surfaces. Any other attribute(s) or aspect(s) as shown and/or described herein with respect to other embodiments may be used.

In one embodiment, a memory array (e.g., 12) comprises strings (e.g., 49 of memory cells (e.g., 56). The memory array comprises a vertical stack (e.g., 18) comprising alternating insulative tiers (e.g., 20) and conductive tiers (e.g., 22). Channel-material strings (e.g., 53) of memory cells (e.g., 56) are in the stack. Conductive vias (e.g., 41) are in insulating material (e.g., 64) that is directly above the channel-material strings. Individual of the conductive vias are directly electrically coupled to individual of the channel-material strings (e.g., through conducting material 31). The conductive vias have respective top surfaces (e.g., 47, 47a). TAVs (e.g., 39) are in the stack and have respective top surfaces (e.g., 51, 51a). At least a portion of the respective conductive-via-top surfaces are elevationally-coincident with at least a portion of the respective TAV-top surfaces. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating first tiers and second tiers having channel-material strings therein. Conductive vias are formed through insulating material that is directly above the channel-material strings. Individual of the conductive vias are directly electrically coupled to individual of the channel-material strings. After forming the conductive vias, horizontally-elongated trenches are formed into the stack to form laterally-spaced memory-block regions. Intervening material is formed in the trenches laterally-between and longitudinally-along the immediately-laterally-adjacent memory-block regions.

In some embodiments, a method used in forming a memory array comprising strings of memory cells comprises forming a stack comprising vertically-alternating first tiers and second tiers having channel-material strings therein. Conductive-via openings are formed in insulating material that is directly above the channel-material strings. Individual of the conductive-via openings are above individual of the channel-material strings. Through-array via (TAV) openings are formed in the stack. Conductive material is formed in the conductive-via openings and in the TAV openings at the same time to form TAVs in the TAV openings and conductive vias in the conductive-via openings. Individual of the conductive vias are directly electrically coupled to the individual channel-material strings.

In some embodiments, a memory array comprising strings of memory cells comprises laterally-spaced memory blocks individually comprising a vertical stack comprising alternating insulative tiers and conductive tiers, and channel-material strings of memory cells in the stack. Intervening material is laterally-between and longitudinally-along the immediately-laterally-adjacent memory blocks. The intervening material extends upwardly from an uppermost of the alternating insulative and conductive tiers to a respective top surface of the intervening material between the blocks. Conductive vias in the insulating material are directly above the channel-material strings. Individual of the conductive vias are directly electrically coupled to individual of the channel-material strings. The conductive vias have respective top surfaces. At least a portion of the respective intervening-material-top surfaces are elevationally-coincident with at least a portion of the respective conductive-via-top surfaces.

In some embodiments, a memory array comprising strings of memory cells comprises a vertical stack comprising alternating insulative tiers and conductive tiers, and channel-material strings of memory cells in the stack. Conductive vias in the insulating material are directly above the channel-material strings. Individual of the conductive vias are directly electrically coupled to individual of the channel-material strings. The conductive vias have respective top surfaces. Through-array vias (TAVs) are in the stack and have respective top surfaces. At least a portion of the respective conductive-via-top surfaces are elevationally-coincident with at least a portion of the respective TAV-top surfaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating first tiers and second tiers having channel-material strings therein;
    forming conductive vias through insulating material that is directly above the channel-material strings, individual of the conductive vias being directly electrically coupled to individual of the channel-material strings;
    after forming the conductive vias, forming horizontally-elongated trenches into the stack to form laterally-spaced memory-block regions;
    forming intervening material in the trenches laterally-between and longitudinally-along the immediately-laterally-adjacent memory-block regions; and
    forming through-array vias (TAVs) in TAV openings, the conductive vias being formed in conductive-via openings, and further comprising:
        forming conductive material of the TAVs and the conductive vias in the conductive-via openings and in the TAV openings, respectively, at the same time.

2. The method of claim 1 comprising forming the TAV openings and the conductive-via openings at different times.

3. The method of claim 2 comprising forming the TAV openings before forming the conductive-via openings.

4. The method of claim 2 comprising forming the TAV openings after forming the conductive-via openings.

5. The method of claim 1 wherein the conductive vias are first conductive vias and further comprising forming second conductive vias directly above and that are individually directly electrically coupled to individual of the first conductive vias.

6. A method used in forming a memory array comprising strings of memory cells, comprising:
    forming a stack comprising vertically-alternating first tiers and second tiers having channel-material strings therein;
    forming conductive vias through insulating material that is directly above the channel-material strings, individual of the conductive vias being directly electrically coupled to individual of the channel-material strings;
    after forming the conductive vias, forming horizontally-elongated trenches into the stack to form laterally-spaced memory-block regions;
    forming intervening material in the trenches laterally-between and longitudinally-along the immediately-laterally-adjacent memory-block regions;
    forming the intervening material to extend upwardly from an uppermost of the alternating first and second tiers to a respective top surface of the intervening material between the memory-block regions;
    forming the conductive vias to have respective top surfaces; and
    only a portion of the respective intervening-material-top surfaces being elevationally-coincident with at least a portion of the respective conductive-via-top surfaces.

7. A method used in forming a memory array comprising strings of memory cells, comprising:
    forming a stack comprising vertically-alternating first tiers and second tiers having channel-material strings therein;
    forming conductive vias through insulating material that is directly above the channel-material strings, individual of the conductive vias being directly electrically coupled to individual of the channel-material strings;
    after forming the conductive vias, forming horizontally-elongated trenches into the stack to form laterally-spaced memory-block regions;
    forming intervening material in the trenches laterally-between and longitudinally-along the immediately-laterally-adjacent memory-block regions;
    forming through-array vias (TAVs) in the stack to have respective top surfaces;
    forming the conductive vias to have respective top surfaces; and
    only a portion of the respective conductive-via-top surfaces being elevationally-coincident with at least a portion of the respective TAV-top surfaces.

8. A method used in forming a memory array comprising strings of memory cells, comprising:
    forming a stack comprising vertically-alternating first tiers and second tiers having channel-material strings therein;
    forming conductive vias through insulating material that is directly above the channel-material strings, individual of the conductive vias being directly electrically coupled to individual of the channel-material strings;
    after forming the conductive vias, forming horizontally-elongated trenches into the stack to form laterally-spaced memory-block regions;
    forming intervening material in the trenches laterally-between and longitudinally-along the immediately-laterally-adjacent memory-block regions;
    forming the intervening material to extend upwardly from an uppermost of the alternating first and second tiers to a respective top surface of the intervening material between the memory-block regions;

forming the conductive vias to have respective top surfaces;

forming through-array vias (TAVs) in the stack to have respective top surfaces; and only a portion of the respective intervening-material-top surfaces being elevationally-coincident with only a portion of the respective conductive-via-top surfaces and with only a portion of the respective TAV-top surfaces.

9. The method of claim 8 wherein at least one of the top surfaces of the intervening material or the top surfaces of the conductive vias are not horizontally planar.

10. The method of claim 9 wherein the top surfaces of the conductive vias are not horizontally planar.

11. The method of claim 10 wherein the top surfaces of the conductive vias are downwardly concave.

12. The method of claim 9 wherein the top surfaces of the intervening material are not horizontally planar.

13. The method of claim 12 wherein the top surfaces of the intervening material are downwardly concave.

14. The method of claim 8 wherein both of the top surfaces of the intervening material and the top surfaces of the conductive vias are not horizontally planar.

15. The method of claim 14 wherein the top surfaces of the conductive vias are downwardly concave.

16. The method of claim 14 wherein the top surfaces of the intervening material are downwardly concave.

17. The method of claim 14 wherein,
the top surfaces of the conductive vias are downwardly concave; and
the top surfaces of the intervening material are downwardly concave.

18. The method of claim 1 wherein the first tiers comprise sacrificial material, and further comprising:
through the trenches, isotropically etching away and replacing the sacrificial material that is in the first tiers with conducting material of individual conductive lines; and
forming the intervening material in the trenches after the etching.

19. The method of claim 18 wherein at least one of the top surfaces of the TAVs or the top surfaces of the conductive vias are not horizontally planar.

20. The method of claim 19 wherein the top surfaces of the conductive vias are not horizontally planar.

21. The method of claim 20 wherein the top surfaces of the conductive vias are downwardly concave.

22. The method of claim 19 wherein the top surfaces of the TAVs are not horizontally planar.

23. The method of claim 22 wherein the top surfaces of the TAVs are downwardly concave.

24. The method of claim 18 wherein both of the top surfaces of the TAVs and the top surfaces of the conductive vias are not horizontally planar.

25. The method of claim 24 wherein the top surfaces of the conductive vias are downwardly concave.

26. The method of claim 24 wherein the top surfaces of the TAVs are downwardly concave.

27. The method of claim 24 wherein,
the top surfaces of the conductive vias are downwardly concave; and
the top surfaces of the TAVs are downwardly concave.

28. The method of claim 1 comprising after forming the intervening material, forming at least one horizontally-elongated isolation structure in a top part of the stack in individual of the memory-block regions, the isolation structure forming laterally-spaced select gates in the top part of the stack in the individual memory-block regions.

29. The method of claim 28 wherein the top surfaces of the conductive vias are downwardly concave.

30. The method of claim 28 wherein the top surfaces of the intervening material are downwardly concave.

31. The method of claim 28 wherein the top surfaces of the TAVs are downwardly concave.

32. The method of claim 28 wherein,
the top surfaces of the conductive vias are downwardly concave;
the top surfaces of the TAVs are downwardly concave; and
the top surfaces of the TAVs are downwardly concave.

33. A method used in forming a memory array comprising strings of memory cells, comprising:
forming a stack comprising vertically-alternating first tiers and second tiers having channel-material strings therein;
forming conductive-via openings in insulating material that is directly above the channel-material strings, individual of the conductive-via openings being above individual of the channel-material strings;
forming through-array via (TAV) openings in the stack; and
forming conductive material in the conductive-via openings and in the TAV openings at the same time to form TAVs in the TAV openings and conductive vias in the conductive-via openings, individual of the conductive vias being directly electrically coupled to the individual channel-material strings.

34. The method of claim 33 wherein the individual conductive-via openings are formed directly above the individual channel-material strings.

35. The method of claim 33 comprising forming the TAV openings and the conductive-via openings at different times.

36. The method of claim 35 comprising forming the TAV openings before forming the conductive-via openings.

37. The method of claim 35 comprising forming the TAV openings after forming the conductive-via openings.

* * * * *